(12) United States Patent
Ohuchi et al.

(10) Patent No.: US 6,653,218 B2
(45) Date of Patent: Nov. 25, 2003

(54) METHOD OF FABRICATING RESIN-ENCAPSULATED SEMICONDUCTOR DEVICE

(75) Inventors: Shinji Ohuchi, Tokyo (JP); Harufumi Kobayashi, Tokyo (JP); Yasushi Shiraishi, Tokyo (JP)

(73) Assignee: Oki Electric Industry Co, Ltd., Tokyo (JP)

(*) Notice: Subject to any disclaimer, the term of this patent is extended or adjusted under 35 U.S.C. 154(b) by 0 days.

(21) Appl. No.: 10/287,532

(22) Filed: Nov. 5, 2002

(65) Prior Publication Data

US 2003/0071352 A1 Apr. 17, 2003

Related U.S. Application Data

(62) Division of application No. 09/434,488, filed on Nov. 5, 1999, now Pat. No. 6,495,916.

(30) Foreign Application Priority Data

Apr. 6, 1999 (JP) .......................................... 11-098589

(51) Int. Cl.[7] .............................................. H01L 21/44
(52) U.S. Cl. ........................................ 438/613; 438/614
(58) Field of Search ............................... 257/737, 738, 257/780; 438/612, 613, 614, 617

(56) References Cited

FOREIGN PATENT DOCUMENTS

JP         10-050772        2/1998

OTHER PUBLICATIONS

Net's Report; Nikkei Electronics; Japan; Published Mar. 8, 1999; No. 738, pp. 174–175; Partial Translation provided, total 5 pages.

"A Candidate for the Chip Size Mounting and a Cheap Method for Producing CSPs Emerges Packages Created in the Wafer Level Process"; Toshimi Kawahara/Development Department; Nikkei Microdevices; Japan; Published Apr. 1998; pp. 164–167, total 9 pages.

"Connection Reliability Requirements, Cleared by CSPs That Underwent Structural Modifications"; Nikkei Microdevices; Published Feb. 1998; pp. 48–53; Partial Translation provided, total 15 pages.

*Primary Examiner*—Wael Fahmy
*Assistant Examiner*—Hoai Pham
(74) *Attorney, Agent, or Firm*—Rabin & Berdo, P.C.

(57) ABSTRACT

A polyimide layer is formed over a semiconductor chip, a rewiring to be connected to each of the electrode pads of the semiconductor chip is formed over the polyimide layer, and a post serving as a terminal is connected to each of the electrode pads via the rewiring, thereby redisposing the electrode pads. A resin for encapsulating the rewirings and the posts is formed on the surface of the semiconductor chip to the extent equivalent to the dimension of the semiconductor chip, and in a groove formed in portions of the resin, around the respective posts, the topmost surface and the sidewall face of the respective posts are exposed out of the resin.

10 Claims, 7 Drawing Sheets

LASER IRRADIATION

LASER IRRADIATION

METHOD OF FABRICATING RESIN-ENCAPSULATED SEMICONDUCTOR DEVICE

This is a Divisional Application of U.S. Ser. No. 09/434,488 filed on Nov. 5, 1999 now U.S. Pat. No. 6,495,916.

BACKGROUND OF THE INVENTION

1. Field of the Invention

The present invention relates to a semiconductor device and a method of fabricating same, and more particularly, to a semiconductor device which is resin-encapsulated in a semiconductor wafer state and a method of fabricating the semiconductor device. Thus, the invention deals with such a semiconductor device as described above having high reliability for interconnection and a method of fabricating the semiconductor device.

2. Description of the Related Art

Portable equipment have lately come into widespread use at a rapid pace, and this has been accompanied by increasing demands calling for semiconductor devices mounted therein that are thinner in thickness, smaller in size, and lighter in weight than conventional ones. Thereupon, a number of packaging technologies have been proposed in order to cope with such demands.

As one of such technologies, a chip size package (referred to hereinafter as CSP) equivalent or substantially equivalent in size to a semiconductor chip with an integrated circuit formed thereon has been developed.

There has been available a conventional CSP wherein a rewiring made of Cu, to be connected to each of electrode pads of a semiconductor chip, is formed, a terminal called a post, to be connected to the rewiring, is formed for redisposing the electrode pads, the surface of the semiconductor chip is encapsulated with resin to a height of the terminals, and a metallic electrode such as a solder ball etc. is provided at the tip of the respective terminals, exposed out of the resin.

In a method of fabricating the CSP, a polyimide layer is first formed over a semiconductor wafer, a rewiring pattern made of Cu, to be connected to an electrode pad of a plurality of semiconductor chips formed on the semiconductor wafer, is formed, and a terminal called a post, to be connected to respective rewirings, is formed, thereby redisposing the electrode pads. Subsequently, the entire surface of the semiconductor wafer with the terminals formed thereon is resin-encapsulated, and after curing of the resin, the resin is abraded to the extent that the tip of the respective terminals is exposed. And the exposed tip of the respective terminals is provided with a metallic electrode such as a solder ball etc. before dicing the semiconductor wafer into separated pieces for individual semiconductor chips.

However, when a temperature cycle test is repeatedly conducted on such a CSP as described above after it is mounted on a substrate, there arises a possibility of cracks occurring to the metallic electrodes such as the solder balls etc. This is attributable to a large difference in thermal expansivity between the CSP and the substrate, and also to a small area of bonding between the respective metallic electrodes and the respective terminals of the CSP due to a narrow spacing between the terminals.

SUMMARY OF THE INVENTION

It is an object of the invention to provide a semiconductor device having high reliability for interconnection and a method of fabricating the semicondutor device.

To this end, the invention provides a semiconductor device comprising a semiconductor chip having a plurality of electrode pads formed on the upper surface thereof, a terminal formed on the upper surface of the semiconductor chip, electrically connected to each of the electrode pads, and a resin formed on the upper surface of the semiconductor chip, encapsulating the terminals such that the terminals are exposed out of the resin to the extent of a predetermined height.

Futher, the present invention provides a method of fabricating the semiconductor device comprising a step of forming a terminal on a plurality of chips formed on a semiconductor wafer, respectively, said terminal being electrically connected to an electrode pad of the respective chips, a step of forming a resin on the upper surface of the semiconductor wafer, on the side of the terminals, so as to encapsulate the terminals, a step of abrading the resin to the extent that the respective terminals is exposed out of the resin, a step of exposing the side wall face of the respective terminals by removing a portion of the resin, around the respective terminals, and a step of dicing the semiconductor wafer into separated pieces for the respective chips.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Embodiments of the invention are described hereinafter with reference to accompanying drawings.

First Embodiment

Figure 1:
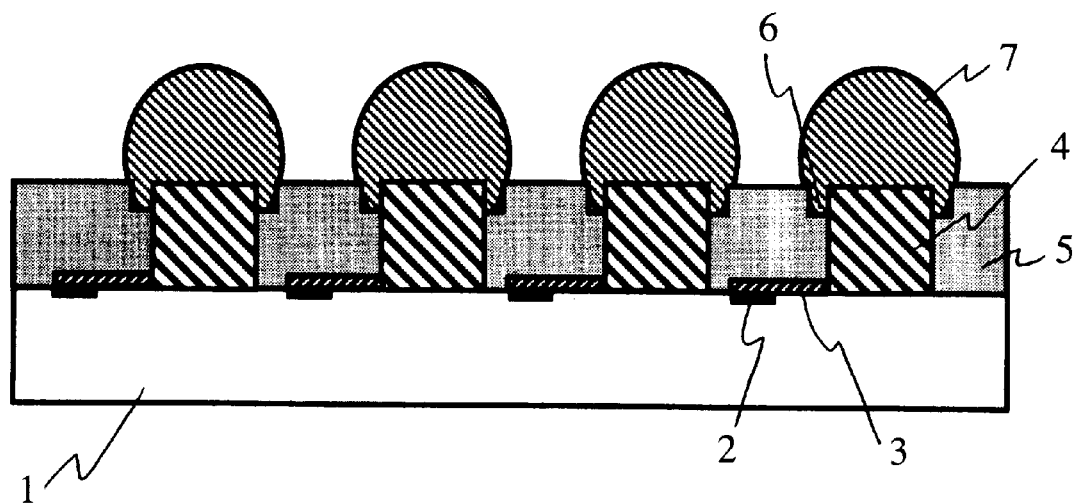
FIG. 1 is a sectional view showing a first embodiment of a semiconductor device according to the invention.

FIG. 1 is a sectional view showing a first embodiment of a semiconductor device according to the invention. In FIG. 1, electrode pads 2, made of aluminum, to be electrically connected to integrated circuits, respectively, are formed over a semiconductor chip 1 with the integrated circuits formed thereon. The electrode pads 2 are exposed out of openings formed in a protective film (not shown) made up of a nitride film etc. for protection of the integrated circuits formed on the semiconductor chip 1.

Further, a polyimide layer (not shown is formed over the semiconductor chip 1, and a rewiring 3 made of Cu, to be connected to each of the electrode pads 2, is formed over the polyimide layer. Further, a post 4 made of Cu, serving as a terminal, is connected to the respective electrode pads 2 via the rewiring 3, thereby redisposing the electrode pads 2. In this case, the post 4 has a height of about 100 $\mu$m and having a diameter of about 250 $\mu$m, while a spacing between the posts 4 is on the order of 500 $\mu$m.

In FIG. 1, a resin 5 for encapsulating the rewirings 3 and the posts 4 is formed on the surface of the semiconductor chip 1 to the extent equivalent to the dimension of the semiconductor chip 1. The resin 5 has a thickness substantially equivalent to the height of the posts 4, that is about 100 $\mu$m. And a groove 6 having a width in the range of about 30 to 50 $\mu$m is formed in the resin 5, around the respective posts 4. As a result, the topmost surface and the sidewall face of the respective posts 4 are free of contact with the resin 5, so that the posts 4 are exposed to the same extent as the depth of the groove 6.

A solder ball 7 serving as a metallic electrode is formed so as to be bonded with the topmost surface and the sidewall face of the respective posts 4, exposed out of the resin 5.

In this case, the extent to which the respective posts 4 are exposed can be regulated by adjusting the depth of the respective grooves 6, and is preferably in the range of 20 to 50 $\mu$m in length from the topmost surface of the respective the posts 4, taking into consideration a range wherein the solder ball 7 can be formed so as to be bonded with the sidewall face of the respective posts 4, which is exposed.

Further, in this embodiment of the invention, if the diameter of the respective posts 4 is reduced to, for example, 150 $\mu$m, flexibility of the respective posts 4 is enhanced, so that the effect of a difference in thermal expansivity between the posts 4 and a substrate on which a semiconductor device is mounted is moderated, and also the groove 6 can be rendered larger in width. Accordingly, it is expected that the solder ball 7 can then be formed with greater ease in such a way as to be bonded with the sidewall face of the respective posts 4, which is exposed.

As described in the foregoing, since the solder ball 7 is bonded with not only the topmost surface of the respective posts 4, but also the sidewall face thereof, a bond strength between the respective posts 4 and the respective solder balls 7 is increased, and cracks and exfoliation can be inhibited from occurring to the solder balls 7 even if stress is developed at spots where the post 4 is bonded with the solder ball 7 at the time of a temperature cycle test, thereby enhancing reliability for interconnection.

Next, embodiments of a method of fabricating a semiconductor device according to the invention are described hereinafter.

FIGS. 2(a) to (f) are schematic views illustrating a method of fabricating the semiconductor device according to the first embodiment of the invention.

In FIGS. 2(a) to (f), reference numeral 8 denotes a semiconductor wafer, 9 a grinding cutter, and 10 a blade. Other parts corresponding to those in FIG. 1 are denoted by the same reference numerals.

Figure 2:
FIGS. 2(a) to (f) are schematic views illustrating a method of fabricating the semiconductor device according to the first embodiment of the invention.
Figure 2:
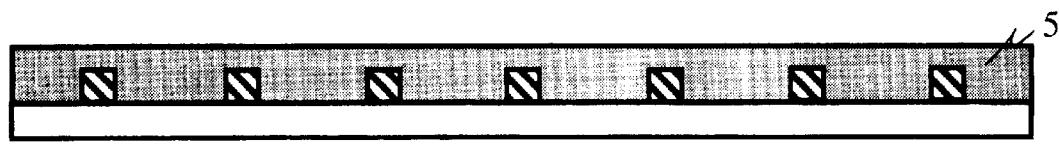
Figure 2:
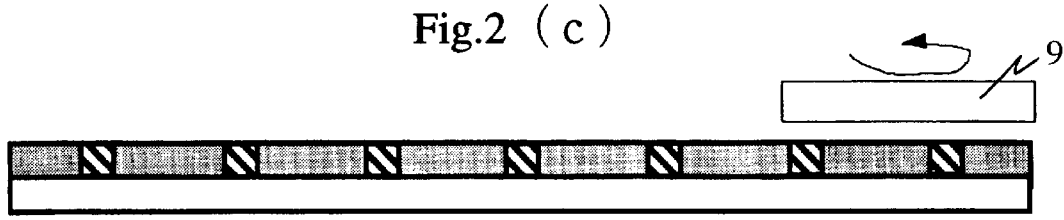
Figure 2:
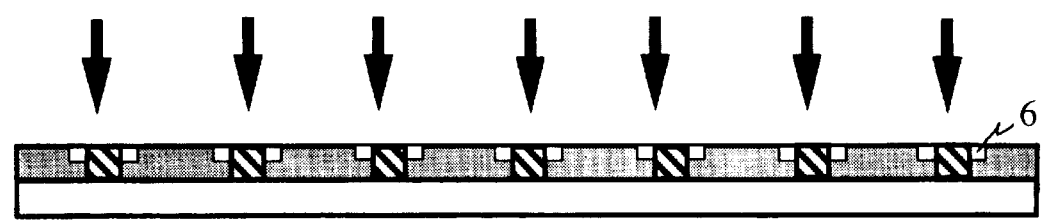
Figure 2:
Figure 2:
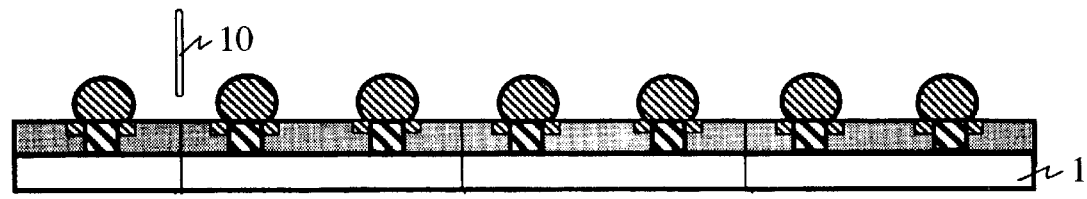

As shown in FIG. 2(a), a polyimide layer is first formed over the semiconductor wafer 8 from which a plurality of the semiconductor chips 1 are formed, and the rewiring 3 made of Cu is formed over the polyimide layer by electroplating in such a way as to be connected to the electrode pad 2 of the respective semiconductor chips 1. Subsequently, the post 4 to be connected to the electrode pad 2 via the rewiring 3 is formed by electroplating. Hereupon, the post 4 is about 100 $\mu$m in height, and circular in a plan view, with the diameter about 250 $\mu$m. In the figure, the polyimide layer, the electrode pads 2 and the rewirings 3 are omitted.

As shown in FIG. 2(b), the resin 5 for encapsulating the rewirings 3 and the posts 4 is formed on the entire surface of the semiconductor wafer 8. The resin 5 has a thickness on the order of 200 $\mu$m.

After curing of the resin 5, the surface of the resin 5 is abraded by use of a grinding cutter 9 so as to expose the topmost surface of the respective posts 4, as shown in FIG. 2(c).

As shown in FIG. 2(d), laser irradiation is applied to a peripheral region of the respective posts 4, about 30 to 50 $\mu$m larger in diameter than the diameter of the respective posts 4. Resin around the respective posts 4 is removed through the laser irradiation, forming a groove 6 about 10 $\mu$m in width. As a result, the sidewall face of the respective posts 4 is exposed. At this point in time, the respective posts 4 made of Cu reflect a laser beam and are left intact. Hereupon, a portion of the respective posts 4 is exposed out of the resin 5 to the extent ranging from 20 to 50 $\mu$m in length. The groove 6 can be formed by the laser irradiation for a duration of several tenths of a second for each one of the posts 4, thus enabling the grooves 6 for all the posts 4 to be formed in several seconds. An extent to which the respective posts 4 are exposed out of the resin 5 can be set by regulating a volume of the resin to be removed, which is achieved by varying a duration of the laser irradiation and output thereof.

Thereafter, solder is applied to the grooves 6 after masking the resin 5, and as shown in FIG. 2(e), the solder ball 7 is formed in such a way as to be bonded with the topmost surface and the side wall face of the respective posts 4, exposed out of the resin 5.

Finally, as shown in FIG. 2(f), the semiconductor wafer 8 is cut into separated pieces for respective semiconductor chips 1 by use of the blade 10, made up of, for example, a diamond blade.

In the foregoing step, the solder balls 7 may be formed after the semiconductor wafer 8 is rendered into separated pieces for the respective semiconductor chips 1. And any metallic electrode having electroconductivity may be used for the solder ball 7. Further, if the resin 5 is formed over the posts 4 to a thickness in the order of several $\mu$m, there is no need of abrading the resin 5 with the use of the grinding cutter 9, and the topmost surface and the side wall face of the posts 4 may be exposed by removing portions of the resin 5 through the laser irradiation. In this connection, the groove 6 may be formed by irradiating a laser beam to each of the posts 4, one by one, however, all the grooves 6 may be formed together by irradiating laser beams to all the posts 4 at one time after disposing a mask with openings, corresponding to the posts 4, in the vicinity of a laser light source, thereby further expediting the formation of all the grooves 6.

Figure 3:
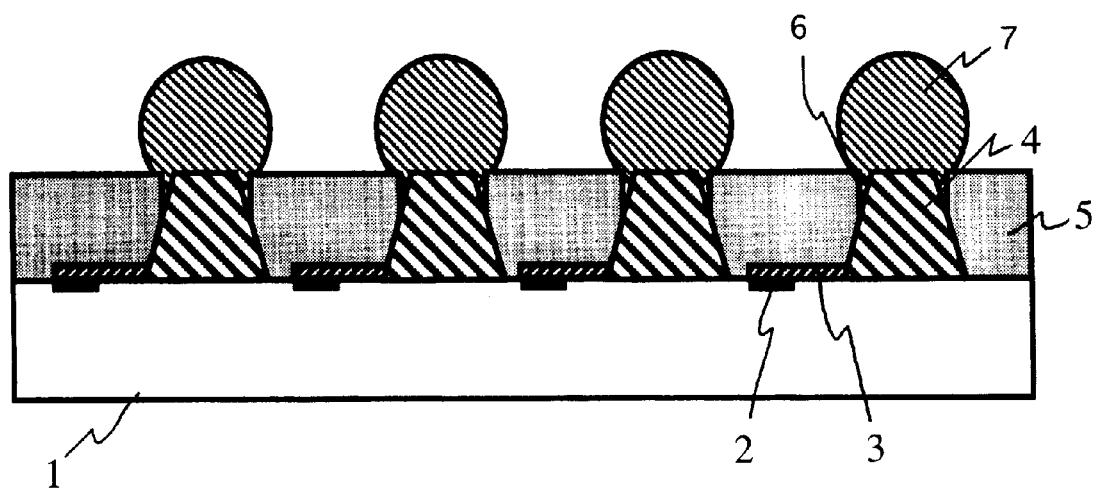
FIG. 3 is a sectional view showing an example of the structure of posts in the first embodiment of the semiconductor device according to the invention.

In carrying out this embodiment of the invention, by adoption of the posts 4 having a cross section substantially in a trapezoidal shape with the width thereof narrowing down towards the topmost surface thereof as shown in FIG. 3, removal of portions of the resin 5, in a peripheral region of the side wall face of the respective posts 4, is performed with greater ease when removing the resin 5 around the respective posts 4 through the laser irradiation.

Second Embodiment

Figure 4:
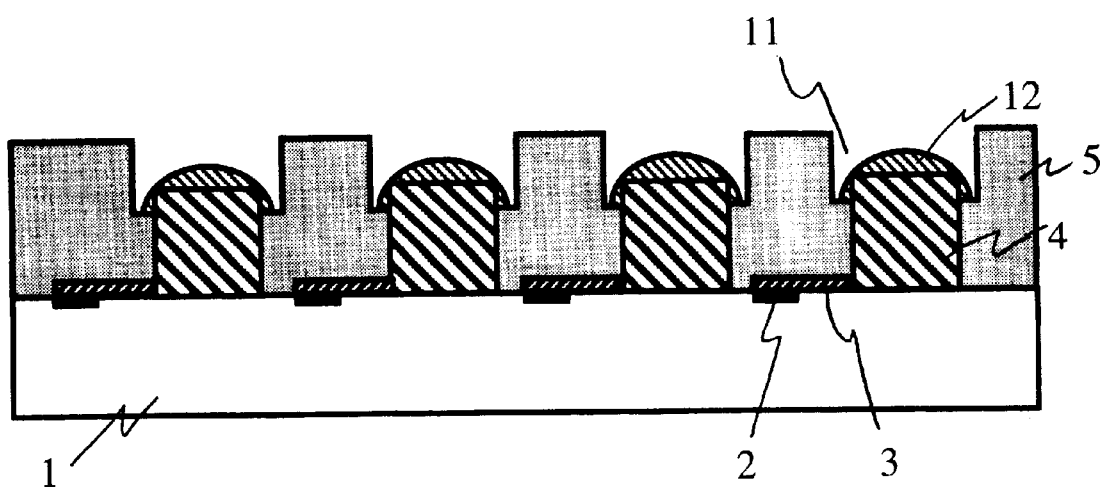
FIG. 4 is a sectional view showing a second embodiment of a semiconductor device according to the invention.

FIG. 4 is a sectional view showing a second embodiment of a semiconductor device according to the invention.

In FIG. 4, parts corresponding to those in FIG. 1 are denoted by the same reference numerals.

In FIG. 4, similarly to the case of the first embodiment, a polyimide layer is formed over a semiconductor chip 1, and a rewiring 3 to be connected to each of electrode pad 2 is connected to each of posts 4 via the rewiring 3, thereby redisposing the electrode pads 2. Hereupon, the post has a height of about 100 μm, and is circular in a plan view, having the diameter of about 250 μm, while a spacing between the posts 4 is in the order of 500 μm.

In FIG. 4, a resin 5 for encapsulating the rewirings 3 and the posts 4 is formed on the surface of the semiconductor chip 1 to the extent equivalent to the dimension of the semiconductor chip 1. The resin 5 has a thickness thicker than the height of the posts 4. In this case, the resin 5 is formed to a thickness of about 200 μm. Further, a groove region 11 provided with a groove around the respective posts 4, having a width in the range of about 30 to 50 μm, is formed in the resin 5, and has a depth in the range of 120 to 150 μm. As a result, the topmost surface and the sidewall face of the respective posts 4 are in a state of exposure from the resin 5. And a solder topping 12 several um in thickness is provided in such a way as to be bonded with the topmost surface and the sidewall face of the respective posts 4, exposed out of the resin 5. Hereupon, an exposed portion of the respective posts 4 falls within the range of 20 to 50 μm in length. This is set in consideration of a range within which the solder topping 12 can be formed so as to be bonded with the sidewall face of the respective posts 4, exposed out of the resin 5.

Before mounting the semiconductor device shown in FIG. 4 on a substrate, electrode pads on the substrate side are provided with solder beforehand, and the solder topping 12 of the semiconductor device is bonded with the top of the solder, whereupon the solder provided on the substrate side enters the groove region 11 of the semiconductor device, so that a solder part can build up by the height of the groove region 11, thereby enabling reduction in distortion of the solder part, and enhancing reliability of the semiconductor device for interconnection.

Further, as with the case of the first embodiment of the invention, since in a region where the solder part is bonded with the respective posts 4, the solder 12 is bonded with not only the topmost surface of the respective posts 4 but also the sidewall face thereof, a bond strength between the post 4 and the solder part is increased, and even if stress is developed in the region where the solder part is bonded with the respective posts 4 at the time of a temperature cycle test, cracks and exfoliation can be inhibited from occurring thereto, thereby enhancing reliability for interconnection.

Next, an embodiment of a method of fabricating the semiconductor device according to the aforesaid embodiment of the invention is described hereinafter.

FIGS. 5(a) to (e) are schematic views illustrating a method of fabricating the semiconductor device according to the second embodiment of the invention. Since the steps of the method of fabricating the semiconductor device as shown in FIGS. 5(a) to (b) are the same as the steps shown in FIGS. 2(a) to (b), description thereof is omitted.

Similarly to the case of the first embodiment of the invention, laser irradiation is applied after curing of the resin 5 to a peripheral region of the respective posts 4, about 30 to 50 μm larger in diameter than the diameter of the respective posts 4, as shown in FIG. 5(c). Resin over the top of and in the periphery of the respective posts 4 is removed by the laser irradiation, thereby forming the groove region 11 having a depth in the range of 120 to 150 μm. As a result, the sidewall face of the respective posts 4 is exposed. At this point in time, the respective posts 4 made of Cu reflect a laser beam and are left intact. Hereupon, a portion of the respective posts 4 is exposed out of the resin 5 to the extent ranging from 20 to 50 μm in length from the topmost surface of the respective the posts 4. The groove region 11 can be formed by the laser irradiation for a duration of several tenths of a second for each one of the posts 4, thus enabling the groove regions 11 for all the posts 4 to be formed in several seconds. The extent to which the respective posts 4 is exposed out of the resin 5 can be set by regulating a volume of resin to be removed, which is achieved by varying a duration of the laser irradiation and output thereof.

Thereafter, as shown in FIG. 5(d), the solder topping 12 is formed to a thickness of several μm in such a way as to be bonded with the topmost surface and the side wall face of the respective posts 4, exposed out of the resin 5. In this case, in a method of forming the solder toppings 12 by way of example, solder can be applied to the groove regions 11 without the use of a mask, thereby forming the solder toppings 12.

Finally, as shown in FIG. 5(e), the semiconductor wafer 8 is cut into separated pieces for respective semiconductor chips 1 by use of the blade 10, made up of, for example, a diamond blade.

In the foregoing steps, the solder toppings 12 may be formed after the semiconductor wafer 8 is cut into separated pieces for the respective semiconductor chips 1.

Figure 6:
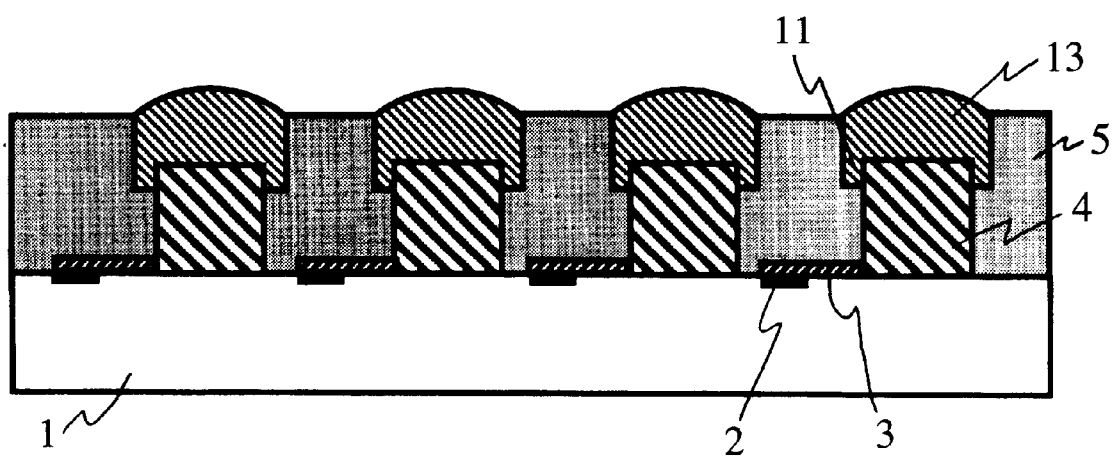
FIG. 6 is a sectional view showing an example of solder toppings formed in the second embodiment of the semiconductor device according to the invention.

In carrying out this embodiment, a solder topping 13 may be formed in such a way as to fill up each of the groove regions 11 as shown in FIG. 6. And in a method of forming the solder toppings 13 by way of example, solder may be applied to the groove regions 11 without the use of a mask, thereby forming the solder toppings 13.

Figure 7:
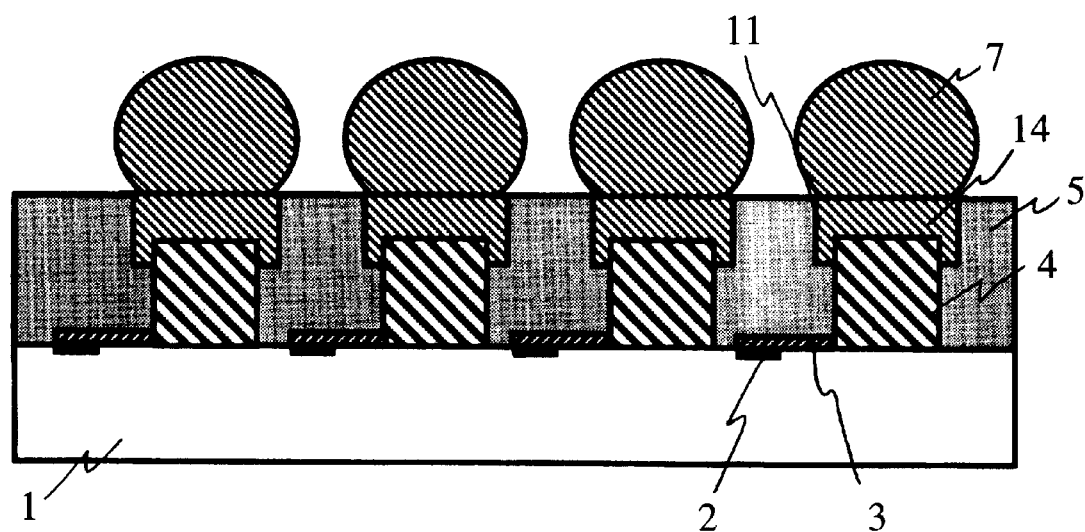
FIG. 7 is a sectional view showing another example of the solder toppings formed in the second embodiment of the semiconductor device according to the invention.

Also, as shown in FIG. 7, a solder topping 14 may be formed in each of the groove regions 11, and subsequently, a solder ball 7 may be further formed on top of the respective solder toppings 14. In this case, the solder balls 7 are formed integrally with the solder toppings 14, however, both may be formed separately from each other.

In a method of forming the solder toppings 14 and the solder balls 7 by way of example, the groove regions 11 are first formed through laser irradiation, and subsequently, the resin 5 is covered with a mask having openings at spots corresponding to the groove regions 11 before applying solder thereto in an amount sufficient to fill up the groove regions 11 and in addition, to correspond to a thickness of the mask. Thereafter, the mask is removed, and the solder balls 7 are formed of a portion of the solder applied, protruding from the surface of the resin 5 to the extent of the thickness of the mask.

In particular, with the semiconductor device shown in FIG. 7, a solder part in each of the groove regions 11 has a height consisting of that of the solder topping 14 and that of the solder ball 7, so that any distortion within the solder part is reduced, and reliability of the semiconductor device for interconnection is further enhanced.

Figure 5:
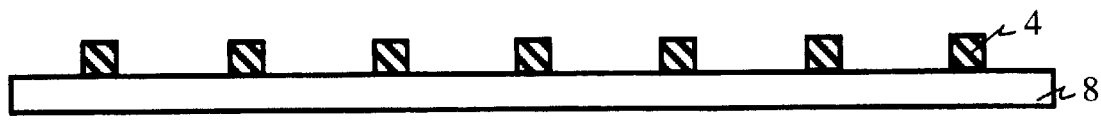
FIGS. 5(a) to (e) are schematic views illustrating a method of fabricating the semiconductor device according to the second embodiment of the invention.
Figure 5:
Figure 5:
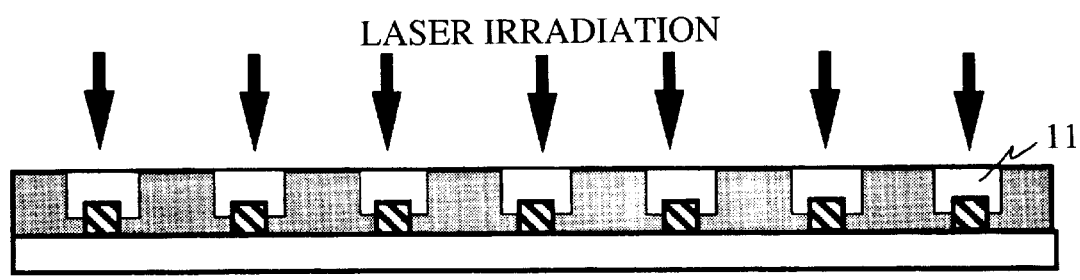
Figure 5:
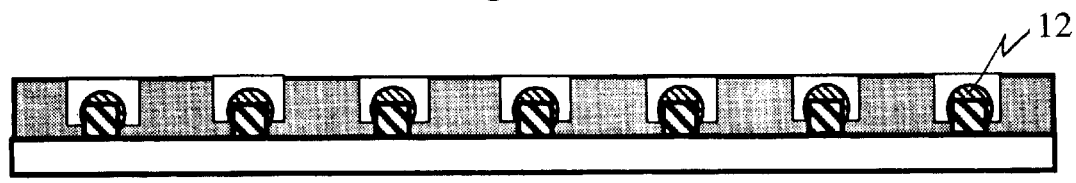
Figure 5:
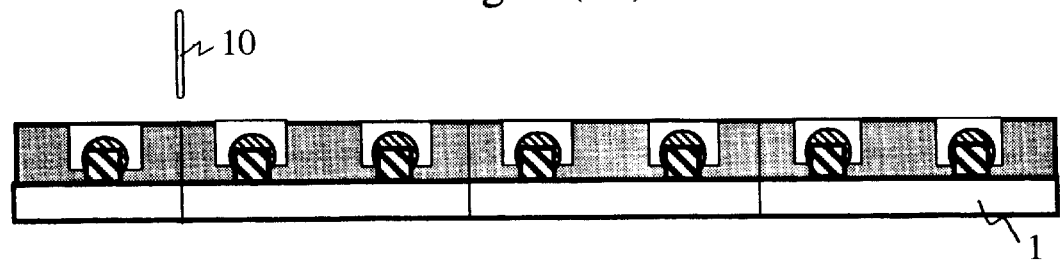

Further, in carrying out this embodiment of the invention, the posts 4 of the semiconductor device shown in FIGS. 4, 5 and 6, respectively, may have a cross section substantially in a trapezoidal shape with the width thereof narrowing down towards the topmost surface thereof as with the case of the first embodiment.

Furthermore, with this embodiment of the invention, if the diameter of the respective posts 4 is reduced to, for example, 150 μm, flexibility of the respective posts 4 is enhanced, so that the effect of a difference in thermal expansivity between the respective posts 4 and a substrate on which the semiconductor device is mounted is moderated, and also the grooves 6 can be rendered larger in width. Accordingly, it is expected that the solder topping 12, 13, or 14 can be formed with greater ease so as to be bonded with the sidewall face of the respective posts 4, which is exposed.

As described in the foregoing, with the semiconductor device according to the invention, the terminals electrically connected to the electrode pads of the semiconductor chip, respectively, are exposed from the resin to the extent of a predetermined height, and in consequence, a bond strength between the terminals and the metallic electrodes for connecting the terminals with a substrate on which the semiconductor device is mounted is increased, thereby enhancing reliability of the semiconductor device for interconnection.

While the invention has been described with reference to preferred embodiments thereof by way of example, it is our intention that the invention be not limited thereto. It will be obvious to those skilled in the art that various changes and other embodiments of the invention may be made by referring to the foregoing description. It is therefore to be intended to cover in the appended claims all such changes and embodiments as fall within the true spirit and scope of the invention.

What is claimed is:

1. A method of fabricating semiconductor devices on semiconductor chips, comprising the steps of:
    a. forming an electrode pad on a first surface of each of a plurality of individual portions of a semiconductor wafer, each individual portion corresponding to a respective semiconductor chip;
    b. forming on each first surface a terminal having terminal first and second end portions, the terminal having a substantially constant terminal diameter from the terminal first end portion to the terminal second end portion;
    c. on each first surface, electrically connecting the terminal first end portion to the electrode pad;
    d. on each first surface, forming, a layer of resin in contact with a sidewall surface of the terminal first and second end portions so as to encapsulate the terminals;
    e. abrading the resin to the extent that the respective terminals are exposed out of the resin;
    f. on each first surface, exposing the side wall face of the terminal second end portion by removing a portion of the resin around the terminal second end portion so that the terminal second end portion is spaced from an exposed surface of the resin that opposes the terminal second end portion, while the terminal first end portion remains encapsulated in the remaining resin; and
    g. dicing the semiconductor wafer to separate the individual portions into separated pieces for the respective chips.

2. The method of fabricating a semiconductor device according to claim 1, wherein said step f includes removal of resin around the respective terminals, through laser irradiation.

3. The method of fabricating a semiconductor device according to claim 1, further comprising the step of forming an electrode in a spherical shape on top of each of the respective terminals after said step f.

4. The method of fabricating a semiconductor device according to claim 3, wherein the step of forming an electrode including filling a space between the terminal second end portion and the opposing exposed surface of the resin with a material of the electrode.

5. A method of fabricating semiconductor devices comprising:
    a. forming an electrode pad on a first surface of each of a plurality of individual portions of a semiconductor wafer each individual portion corresponding to a respective semiconductor chip;
    b. forming on each first surface a terminal having terminal first and second end portions, the terminal having a substantially constant terminal diameter from the terminal first end portion to the terminal second end portion;
    c. on each first surface, electrically connecting the terminal first end portion to the electrode pad;
    d. on each first surface, forming a layer of resin in contact with a sidewall surface of the terminal first and second end portions, so as to encapsulate the terminals;
    e. on each first surface, removing a portion of the resin over the topmost surface of the terminal second end portion, and exposing the sidewall surface of the terminal second end portion by removing a portion of the resin around the terminal second end portion, so that the terminal second end portion is spaced from an exposed surface of the resin that opposes the terminal second end portion, while the terminal second end portion remains encapsulated in the remaining resin; and
    f. dicing the semiconductor wafer into separated pieces for the respective chips.

6. The method of fabricating a semiconductor device according to claim 5, wherein said step e includes removal of portions of the resin over the topmost surface of and around the sidewall face of the respective terminals through laser irradiation.

7. The method of fabricating a semiconductor device according to claim 5, further comprising the step of forming an electrode in a spherical shape on a portion of each of the respective terminals exposed during said step e.

8. The method of fabricating a semiconductor device according to claim 7, wherein the step of forming an electrode including filling a space between the terminal second end portion and the opposing exposed surface of the resin with a material of the electrode.

9. A method of fabricating semiconductor devices on semiconductor chips, comprising the steps of:

forming an electrode pad on a chip first surface of each of a plurality of individual portions of a semiconductor wafer, each individual portion corresponding to a respective semiconductor chip, each individual portion having a chip second surface opposite to the chip first surface;

forming on each first chip surface a terminal having a substantially constant diameter from the first end portion to the second end portion, and having a first end portion electrically connected to the electrode pad, and a second end portion, the terminal first end portion having a first end portion sidewall surface, the terminal second end portion having a second end portion sidewall surface, providing, on each chip first surface and surrounding the terminal, a layer of resin in contact with the first and second end portion sidewall surfaces, with the resin layer having a thickness substantially equivalent to a height of the terminal such that a top surface of the terminal is exposed;

on each first surface, exposing the sidewall surface of the terminal second end portion by removing a portion of the resin around the terminal second end portion so that the terminal second end portion is spaced from an exposed surface of the resin that opposes and surrounds the terminal second end portion, such that the resin surrounding the terminal second end portion has no contact with the terminal, while the terminal first end portion remains encapsulated in the remaining resin, and forming an electrode connected with both the exposed top surface and the exposed second end portion sidewall surface of the terminal.

10. The method of fabricating a semiconductor device according to claim 9, wherein the step of forming an electrode includes filling a space between the terminal second end portion and the opposing exposed surface of the resin with a material of the electrode.

* * * * *